(12) United States Patent
Talledo

(10) Patent No.: US 11,542,152 B2
(45) Date of Patent: Jan. 3, 2023

(54) SEMICONDUCTOR PACKAGE WITH FLEXIBLE INTERCONNECT

(71) Applicant: STMICROELECTRONICS, INC., Calamba (PH)

(72) Inventor: Jefferson Talledo, Calamba (PH)

(73) Assignee: STMicroelectronics, Inc., Calamba (PH)

( * ) Notice: Subject to any disclaimer, the term of this patent is extended or adjusted under 35 U.S.C. 154(b) by 232 days.

(21) Appl. No.: 16/934,981

(22) Filed: Jul. 21, 2020

(65) Prior Publication Data

US 2021/0032098 A1 Feb. 4, 2021

Related U.S. Application Data

(60) Provisional application No. 62/879,970, filed on Jul. 29, 2019.

(51) Int. Cl.
*B81B 7/00* (2006.01)
*B81C 1/00* (2006.01)

(52) U.S. Cl.
CPC ............ *B81B 7/0051* (2013.01); *B81B 7/007* (2013.01); *B81C 1/00301* (2013.01); *B81C 1/00325* (2013.01); *B81B 2207/07* (2013.01)

(58) Field of Classification Search
None
See application file for complete search history.

(56) References Cited

U.S. PATENT DOCUMENTS

| | | | |
|---|---|---|---|
| 5,777,386 A * | 7/1998 | Higashi | H01L 23/13 257/737 |
| 5,907,474 A | 5/1999 | Dolbear | |
| 6,674,159 B1 | 1/2004 | Peterson et al. | |
| 6,809,412 B1 | 10/2004 | Tourino et al. | |
| 2004/0043540 A1* | 3/2004 | Kinsman | H01L 27/14634 257/E31.117 |
| 2005/0114613 A1* | 5/2005 | Otani | G11C 5/04 257/E25.013 |
| 2007/0278639 A1* | 12/2007 | Bauer | H01L 25/0657 257/E23.18 |

(Continued)

OTHER PUBLICATIONS

Hayden et al., "Thermal & Electrical Performance and Reliability Results for Cavity-Up Enhanced BGAs," 1999 Proceedings, 49th Electronic Components and Technology Conference, San Diego, CA, Jun. 1-4, 1999, 7 pages.

*Primary Examiner* — Benjamin P Sandvik
(74) *Attorney, Agent, or Firm* — Seed IP Law Group LLP

(57) ABSTRACT

A cavity type semiconductor package with a substrate and a cap is disclosed. The semiconductor package includes a first semiconductor die coupled to the substrate and a layer of flexible material on a surface of the cap. A trace is on the layer of flexible material. The cap is coupled to the substrate with the layer of flexible material and the trace between the cap and the substrate. A second semiconductor die is coupled to the layer of flexible material and the trace on the cap. The cap further includes an aperture to expose the second semiconductor die to the ambient environment. The layer of flexible material absorbs stress during operation cycles of the package induced by the different coefficient of thermal expansions of the cap and the substrate to reduce the likelihood of separation of the cap from the substrate.

20 Claims, 10 Drawing Sheets

(56) References Cited

U.S. PATENT DOCUMENTS

| | | | |
|---|---|---|---|
| 2009/0032927 A1* | 2/2009 | Kim | H01L 25/0657 438/109 |
| 2011/0012264 A1* | 1/2011 | Linderman | H01L 31/02008 257/773 |
| 2011/0075875 A1 | 3/2011 | Wu et al. | |
| 2011/0254171 A1* | 10/2011 | Guo | H01L 23/5387 257/774 |
| 2012/0181683 A1* | 7/2012 | Yamazaki | H01L 25/105 257/704 |
| 2020/0279787 A1* | 9/2020 | Faul | H01L 23/4985 |

* cited by examiner

SEMICONDUCTOR PACKAGE WITH FLEXIBLE INTERCONNECT

BACKGROUND

Technical Field

The present disclosure is directed to semiconductor packages and more particularly, cavity-type semiconductor packages.

Description of the Related Art

Cavity-type semiconductor packages are known for use with microelectromechanical systems ("MEMS") devices. Most cavity-type packages include a single semiconductor die coupled to a substrate. However, a single die does not have adequate functionality for many modern system requirements. Placing two or more dies on the substrate side by side results in larger package sizes, which is often undesirable for semiconductor packages because space is at a premium in the environments in which they are used. Further, known cavity-type packages experience a mismatch in the coefficient of thermal expansion ("CTE") between a lid of the package, the substrate, and an adhesive bonding the lid to the substrate. In other words, over repeated operation cycles, the lid, the substrate, and the adhesive will expand different amounts during each cycle due to the different CTEs of the materials of each component and the change in temperature during each operation cycle. These repeated expansions and contractions result in cracking of the adhesive between the lid and the substrate or separation of the adhesive from the lid or the substrate, which leads to package failure. This problem is only exacerbated with larger packages, as the increase in volume of material results in an increase in the amount of expansion and contraction during operation cycles.

BRIEF SUMMARY

The present disclosure is directed to semiconductor packages with a substrate and a cap coupled to the substrate. A first semiconductor die is coupled to the substrate. In some examples, wires are bonded between the first die and the substrate to establish an electrical connection between the same. Further, a layer of flexible material is formed on the cap with an electrical wire or trace on the layer of flexible material. When the cap is coupled to the substrate, the layer of flexible material is between the cap and the substrate. A second semiconductor die is coupled to the layer of flexible material on the cap. The trace on the layer of flexible material establishes an electrical connection between the second die and the substrate. The substrate, the layer of flexible material, and the cap each have their own coefficient of thermal expansion. During operation, heat produced by operation of the package will expand each of these components a different amount because of the different coefficients of thermal expansion. As such, the layer of flexible material absorbs the stress produced within the package by the difference in the coefficient of thermal expansion between the substrate and the cap. In other words, during operation, the layer of flexible material deforms such that expansion and contraction of the cap and the substrate does not result in the cap separating from the substrate.

Further, the cap preferably includes a hole such that the second die is exposed to an ambient environment. As such, the second die may be one of several different types of sensors for detecting conditions of the ambient environment. In some examples, the layer of flexible material covers an entire surface of the cap, while in other examples, the layer of flexible material is on only certain parts of the surface of the cap corresponding to locations where electrical connections are to be established with the second die. The present disclosure also includes a method of assembly or manufacturing of the above described cavity type packages.

BRIEF DESCRIPTION OF THE SEVERAL VIEWS OF THE DRAWINGS

For a better understanding of the embodiments, reference will now be made by way of example only to the accompanying drawings. In the drawings, identical reference numbers identify similar elements or acts. In some figures, the structures are drawn exactly to scale. In other figures, the sizes and relative positions of elements in the drawings are not necessarily drawn to scale. For example, the sizes, shapes of various elements and angles may be enlarged and positioned in the figures to improve drawing legibility.

DETAILED DESCRIPTION

The present disclosure is generally directed to cavity-type semiconductor packages including multiple semiconductor dies and a layer of flexible material between a cap of the package and a substrate of the package to reduce the likelihood of separation between the cap and the substrate as a result of operation cycles.

Figure 1:
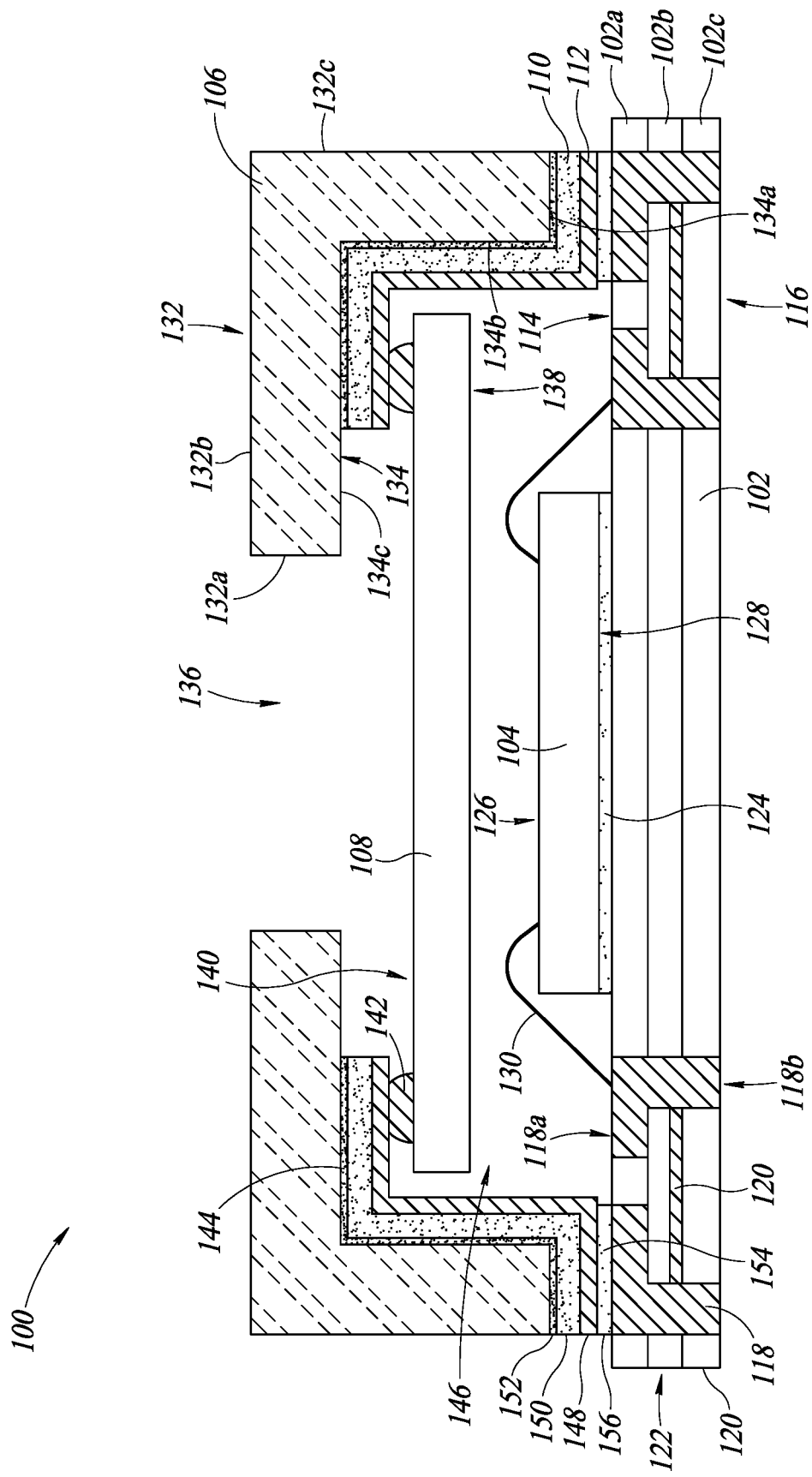
FIG. 1 is a cross-sectional view of an embodiment of a semiconductor package illustrating a layer of flexible material between a cap and a substrate of the semiconductor package according to the present disclosure.

For example, FIG. 1 illustrates a package 100 having a substrate 102, a first semiconductor die 104 on the substrate 102, a cap 106 coupled to the substrate 102, a second semiconductor die 108 on the cap 106, a layer of flexible material 110 on the cap 108, and a conductive trace 112 on the layer of flexible material 110. As used herein, "flexible" refers to a material with a Young's modulus in the range of 0.01 pascals to up to 5 gigapascals ($kN/mm^2$), unless the context requires otherwise. However, other embodiments include "flexible" materials with a modulus of elasticity above 5 gigapascals or less than 0.01 gigapascals.

The substrate 102 includes a first surface 114 and a second surface 116 opposite the first surface 114. In the embodiment of FIG. 1, the substrate 102 includes first, second, and third layers 102a, 102b, 102c, respectively. While only three layers are illustrated for clarity, the substrate 102 may include significantly more, or less layers, such as only one or two layers, or more than three layers. Each of the layers 102a, 102b, 103c are dielectric layers. In one embodiment, the substrate 102 is a printed circuit board, although other substrates are expressly contemplated herein.

The substrate 102 further includes a plurality of conductive vias 118 extending through the substrate 102 from the first surface 114 to the second surface 116 to facilitate a connection between the package 100 and an external device, such as a further substrate or another integrated circuit or die, for example. Each of the vias 118 includes a first surface 118a and a second surface 118b opposite the first surface. In one embodiment, the first surface 118a of each via 118 is coplanar with the first surface 114 of the substrate 102 and the second surface 118b of each via 118 is coplanar with the second surface 116 of the substrate 102 such that the vias 118 establish electrical contacts or contact pads on the surfaces 114, 116 of the substrate 102 and an electrical path through the substrate 102. In an alternative embodiment, one or both of the surfaces 118a, 118b of the vias 118 extend beyond the surfaces 114, 116 of the substrate 102.

In one embodiment, a plurality of solder balls are coupled to the vias 118 on the second surface 116 of the substrate 102. A conductive trace or wiring line 120 connects adjacent vias 118 and is formed on the second layer 102b of the substrate 102. However, it is to be appreciated that in other embodiments, the trace 120 is formed on any of the layers 102a, 102b, 102c of the substrate 102. The substrate 102 further includes a sidewall 120 extending between the first and second surfaces 114, 116 of the substrate 102. In an embodiment, the substrate 102 is square or rectangular, and as such, the sidewall 120 includes four walls. The sidewall 120 includes a third surface 122 extending between the first and second surfaces 114, 116 of the substrate 102. The third surface 122 may also be referred to herein as a side surface of the substrate 102. In one embodiment, the third surface 122 extends beyond the cap 106, while in other embodiments, the third surface 122 is flush or coplanar with the cap 106, as described herein.

The first semiconductor die 104 (which may be referred to herein as a first die 104 or a die 104) is coupled to the substrate 102 with a die attach material 124, which may be solder, tape, or some other conductive or insulating adhesive, for example. The first die 104 includes a first surface 126 and a second surface 128 opposite the first surface 126. The second surface 128 of the first die 104 is coupled to the first surface 114 of the substrate 102 with the die attach material 124. A plurality of wires 130 are coupled between the first die 104 and the substrate 102, and more specifically between the first surface 126 of the die 104 and the vias or contacts 118 of the substrate 102. In one embodiment, the wires 130 are metal wires coupled to the die 104 and the substrate 102 with solder, while in other embodiments, the wires 130 are formed by applying a conductive paste (e.g. a paste with entrained metal particles) on a sacrificial layer and heating the resulting combination to solidify the wires and remove the sacrificial layer. In one embodiment, the first die 104 is an application specific integrated circuit (ASIC) die with various integrated circuits, resistors, transistors, or other electrical components formed on a semiconductive material such as silicon.

The cap 106 includes a first surface 132 and a second surface 134 opposite the first surface 132. An aperture 136 extends through the cap 106 from the first surface 132 to the second surface 134. As shown in FIG. 1, the aperture 136 is preferably aligned with the second semiconductor die 108. In other words, in one embodiment, a vertical axis through a center of the aperture 136 is aligned with a vertical axis through a center of the second semiconductor die 108 relative to the substrate 102. In one embodiment, an area defined by the aperture 136 is less than an area of the second semiconductor die 108. However, in other embodiments, the area defined by the aperture 136 is equal to or greater than an area of the second semiconductor die 108. The area of the aperture 136 can be selected according to design preference or according to specifications for an application of the package 100. In one embodiment, the cap 106 does not include the aperture 136, but rather, is a solid and continuous material.

The cap 106 is preferably formed of molded epoxy or metal, for example. In embodiments where the cap 106 is metal, the layer of flexible material 110 preferably covers the entire second surface 134 of the cap 106 between the connection with the second semiconductor die 108 and the substrate 102 and is preferably formed of an insulating material, such as polydimethylsiloxane or another insulator to electrically isolate the metal cap 106. The first surface 132 of the cap includes a first portion 132a, a second portion 132b, and a third portion 132c. In one embodiment, the first portion 132a is parallel to the third portion 132c and the second portion is perpendicular to the first and third portions 132a, 132c. The third portion 132c may also be referred to as a sidewall or a side surface of the cap 106. Further, the second surface 134 of the cap 106 includes a first portion 134a, a second portion 134b, and a third portion 134c wherein the first and third portions 134a, 134c are parallel to each other and the second portion 134b is perpendicular to the first and third portions 134a, 134c.

Further, in one embodiment, the first and third portions 134a, 134c of the second surface 134 are parallel to the second portion 132b of the first surface 132 and the first and third portions 132a, 132c of the first surface 132 are parallel to the second portion 134b of the second surface 134. As such, each of the portions 132a, 132b, 132c of the first surface 132 and each of the portions 134a, 134b, 134c of the second surface 134 are perpendicular to adjacent portions. In other embodiments, each of the portions is at an angle relative to adjacent portions that is not equal to 90 degrees.

The second semiconductor die 108 (which may be referred to herein as a second die 108 or a die 108) is coupled to the cap 106 and includes a first surface 138 and a second surface 140 opposite the first surface 138. More specifically, the second surface 140 of the die 108 is coupled to the trace 112 on the layer of flexible material 110 on the third portion 134c of the second surface 134 of the cap 106. The second die 108 is coupled to the trace 112 with solder 142. The second die 108 is preferably a type of semiconductor device, such as a MEMS device, a microphone, a pressure sensor, any type of flip chip die, or even a printed circuit board, for example. The second die 108 is preferably exposed to an ambient environment through the aperture 136, although in other embodiments without the aperture 136, the second die 108 is not exposed to the ambient environment.

In one embodiment, an area of the second die 108 is greater than an area of the first die 104, while in other embodiments, an area of the first die 104 is greater than an area of the second die 108 and in yet further embodiments, the area of the first die 104 and the second die 108 are equal. As shown in FIG. 1, the second die 108 is disposed such that the first surface 138 of the second die 108 faces the first surface 126 of the first die 104. In other words, the second die 108 is inverted relative to the first die 104 such that the second surfaces 128, 140 of each respective die 104, 108 are spaced further from each other than the first surfaces 126, 138 of each die 104, 108. Moreover, the package 100 further includes a cavity 146 between the substrate 102 and the cap 106. The first and second die 104, 108 are received internally to the package 100 in the cavity 146.

The layer of flexible material 110 is coupled to the second surface 134 of the cap 106 with an adhesive 144, which may be tape or glue, for example. The layer of flexible material 110 preferably extends along the first portion 134a, the second portion 134b, and a part of the third portion 134c of the second surface 134 of the cap 106. In other words, in one embodiment, the layer of flexible material 110 is only on the second surface 134 of the cap 106 and does not extend along the first surface 132 of the cap 106. As shown in FIG. 1, the layer of flexible material 110 extends along a majority of the second surface 134 of the cap 106, but does not cover the entire second surface 134 of the cap 106. Rather, the layer of flexible material 110 extends along the second surface 134 of the cap 106 from the substrate 102 to a location on the cap 106 corresponding to a location of contacts or solder 142 on the second die 108. As such, the size or length of the layer of flexible material 110 can be selected according to package design or specification. In other embodiments, as described herein, the layer of flexible material 110 is formed on the entire second surface 134 of the cap 106.

The layer of flexible material 110 is preferably a stretchable elastomeric substrate such as polydimethylsiloxane (PDMS). However, other embodiments of the layer of flexible material 110 include other materials with elastic properties, such as various rubbers, thermoplastics, plastics, or polymers, either alone or in combination. The trace 112 is on the layer of flexible material 110 to establish an electrical connection between the second die 108 and the substrate 108, and more particularly, one of the contacts or vias 118 of the substrate. Further, the second die 108 is electrically connected to the first die 104 through the vias, the trace 120 in the substrate 102, and the layer of flexible material 110 and the trace 112, such that the second die 108 can communicate with the first die 104. Preferably, the trace 112 extends along an entirety of a length of the layer of flexible material 110, but in other embodiments, a length of the trace 112 is less than a length of the layer of flexible material 110. Further, in one embodiment, an edge 148 of the trace 112, an edge 150 of the layer of flexible material 110, and an edge 152 of the adhesive 144 are coplanar with the cap 106. More specifically, the edges 148, 150, 152 of the trace 112, the layer of flexible material 110, and the adhesive 144 are coplanar with the third portion 132c of the first surface 132 of the cap 106.

The trace 112 is coupled to the substrate with an adhesive 154, which is preferably solder or an electrically conductive glue or adhesive. In one embodiment, an edge 156 of the adhesive 154 is coplanar with the cap 106, similar to the edges 148, 150, 152 of the trace 112, the layer of flexible material 110, and the adhesive 144. As such, when the cap 106 is coupled to the substrate, the adhesive 154, the trace 112, the layer of flexible material 110, and the adhesive 144 are between the cap 106 and the substrate 102. Although FIG. 1 illustrates that the sidewall 120 of the substrate 102 extends beyond the cap 106, the layer of flexible material 110 and the trace 112, other embodiments of the present disclosure include the sidewall 120 of the substrate coplanar with the cap 106 and the layer of flexible material 110. In yet further embodiments, the cap 106 extends to cover the edges 148, 150, 152, 156 of the trace 112, the layer of flexible material 150, the adhesive 144 and the adhesive 154, respectively. In such an embodiment, the extension of the cap 106 may or may not be coupled to the substrate 102.

As will be described further below, the layer of flexible material 110 accounts for the mismatch in the coefficient of thermal expansion between the cap 106, the substrate 106, and the adhesive 154 by introducing flexibility into the package 100 to reduce or prevent cracking of the adhesive 154 or separation of the cap 106 from the substrate 102. In other words, because the layer of flexible material 110 is elastic, when the substrate 102 and the cap 106 expand or contract during an operation cycle, the layer of flexible material 110 deforms to absorb stress within the package 100 to prevent cracking of the adhesive 154 or separation of the cap 106 from the substrate 102.

During operation of the package 100, the first die 104 and the second die 108 produce heat. The heat from the first die 104 is transferred to the substrate 102 and the heat from the second die 108 is transferred, at least in part to the cap 106. Some of the heat from each die 104, 108 is dissipated by convection cooling through the aperture 136. However, the remaining heat is transferred to the substrate 102 and the cap 106, as above. The substrate 102 is formed of a first material with a first coefficient of thermal expansion (CTE) and the cap 106 is formed from a second, different material with a second CTE. In one embodiment, the first CTE is greater than the second CTE, while in other embodiments, the first CTE is less than the second CTE. Further, the second die 108 comprises a material with a third CTE different than the first and second CTEs and the solder 142 between the second die 108 and the trace 112 has yet a fourth CTE that is different than the first through third CTEs. In any event, the heat produced by operation of the package 100 results in expansion of the substrate 102 and the cap 106. In an embodiment, the substrate 102 and the cap 106 expand more than the second die 108 during operation. Further, the substrate 102 and the cap 106 expand different amounts relative to each other because of the difference in CTE between these components.

The relative expansion of each component of the package 100 introduces stress into the package 100, and particularly at the connection between the cap 106 and the substrate 102 and at the connection between the second die 108 and the cap 106. Stress is also present in the package 100 after operation as the package 100 cools. For example, each of the substrate 102, the cap 106, the second die 108, and the solder 142 ill contract relative to their respective heated, expanded states a different amount due to their different CTEs. During heating or cooling, the layer of flexible material 110 deforms to absorb the stress introduced by expansion of components of the package 100. In other words, the layer of flexible material 110 is an elastic material that expands or contracts to reduce the stress at the connection between the cap 106 and the substrate 102 and at the connection between the second die 108 and the cap 106.

Figure 2:
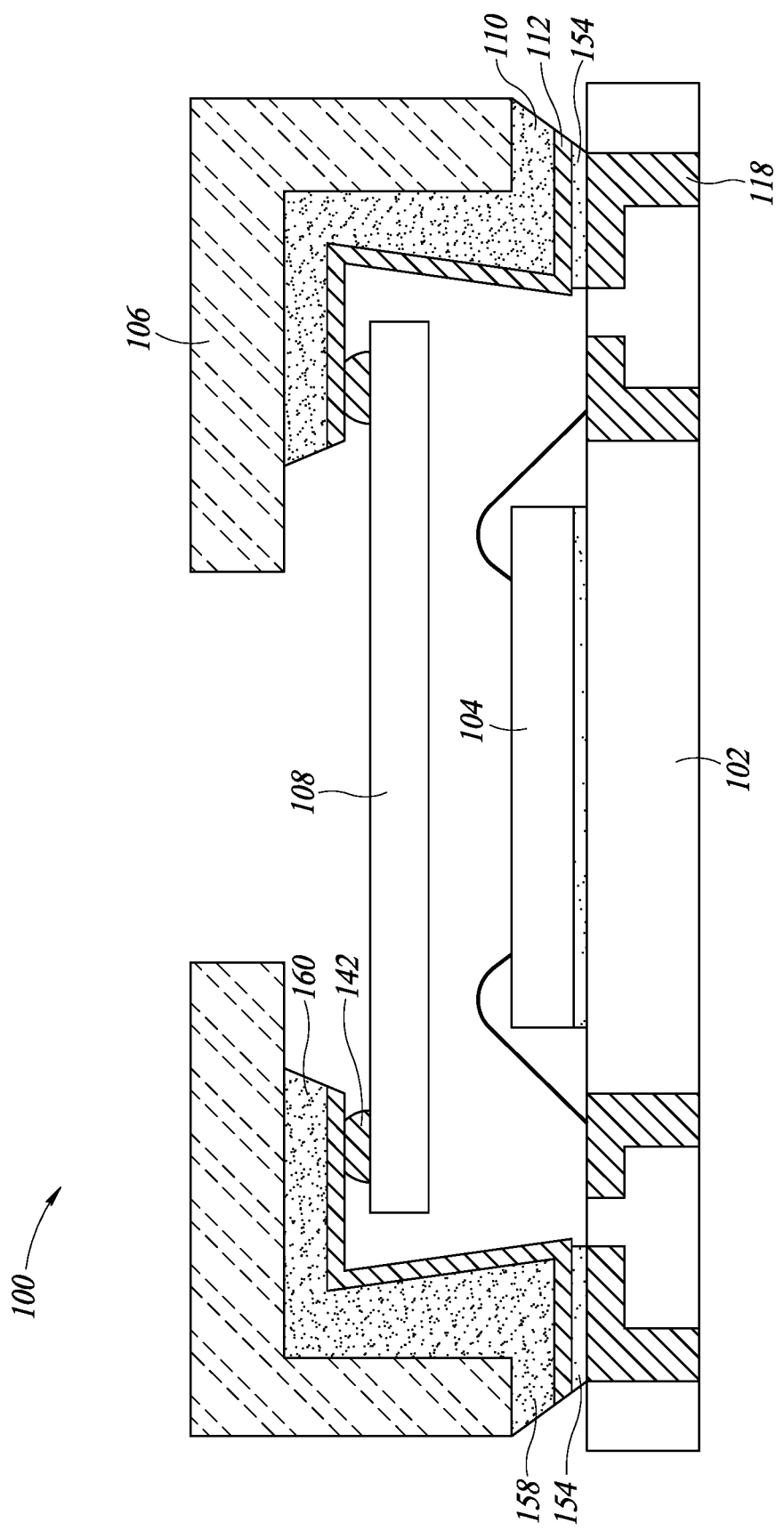
FIG. 2 is a cross-sectional view of the package of FIG. 1 illustrating expansion and contraction of the cap, the substrate, and the layer of flexible material.

For example, FIG. 2 illustrates the package 100 during a cooling cycle of the package 100 following operation of the package 100. In other words, FIG. 2 corresponds to a state of the package 100 following operation where the package 100 is cooling from its heated, expanded state. In FIG. 2, the substrate 102 contracts to its original, cooled state, faster than the cap 106. As such, a portion 158 of the layer of flexible material 110 proximate the connection between the cap 106 and the substrate 102 expands to reduce stress on the adhesive 154 between the trace 112 and the substrate 102. Further, the cap 106 returns to its original, resting state at a different rate than the second die 108. As such, a portion 160 of the layer of flexible material 110 proximate the solder 142 connecting the second die 108 to the cap 106 deforms to reduce the stress on the solder 142. The amount of deformation of the layer of flexible material 110 in FIG. 2 has been exaggerated for clarity. However, FIG. 2 illustrates that the layer of flexible material 110 expands or contracts to reduce stress at the connection between the cap 106 and the substrate 102 and at the connection between the second die 108 and the trace 112, which reduces the risk that these connections will separate or otherwise fail. Put another way, the layer of flexible material 110 increases reliability and the service life of the package 100 by reducing stress at certain connections in the package 100 where separation can result in package failure.

Figure 3:
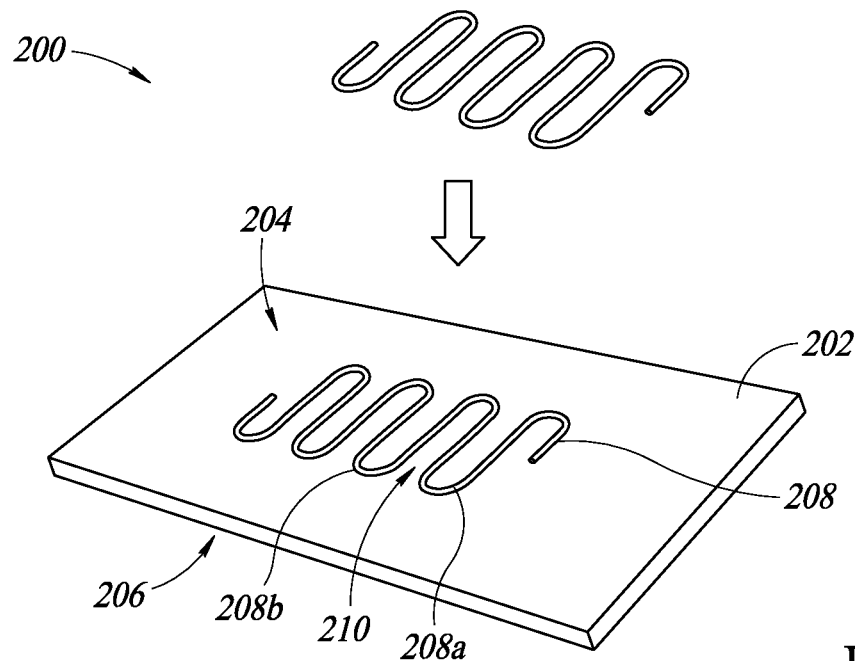
FIG. 3 is a schematic representation of an embodiment of a trace on a surface of a layer of flexible material according to the present disclosure.

FIG. 3 is a schematic representation of an embodiment of a layer of flexible material 200 (which may also be referred to herein as a flexible interconnect 200). In one embodiment, the layer of flexible material 110 of FIG. 1 is the same as the layer of flexible material 200 in FIG. 3. The layer of flexible material 200 includes a flexible substrate 202, which may be PDMS, or some other type of material with elastic properties, such as various rubbers, plastics, thermoplastics or polymers, alone or in combination. The flexible substrate 202 includes a first surface 204 and a second surface 206 opposite the first surface 204. A trace 208 is formed on the first surface 204 of the flexible substrate 202. In one embodiment, the trace 208 is printed on the first surface 204 of the flexible substrate 202. In other embodiments, the trace 208 is formed by plating, masking, painting, or electrodeposition. The trace 208 is preferably copper or a copper alloy, although other materials may be used, such as gold, silver, palladium, tin, or nickel, alone or in combination with each other or copper or a copper alloy. Further, trace 208 preferably has an undulating pattern on the first surface 204 of the flexible substrate 202 with gaps or spaces 210 between adjacent portions 208a, 208b of the trace 208. The gaps 210 are exaggerated in FIG. 3 for clarity, in actuality they are considerably less than 1 mm in width, such as less than 500 micrometers, or more preferably less than 100 micrometers. As such, the trace 208 may be visible to an observer as a continuous layer of metal. In one embodiment, the portions 208a, 208b of the trace 208 are in contact with each other, while in other embodiments, the trace 208 includes gaps 210.

Figure 4:
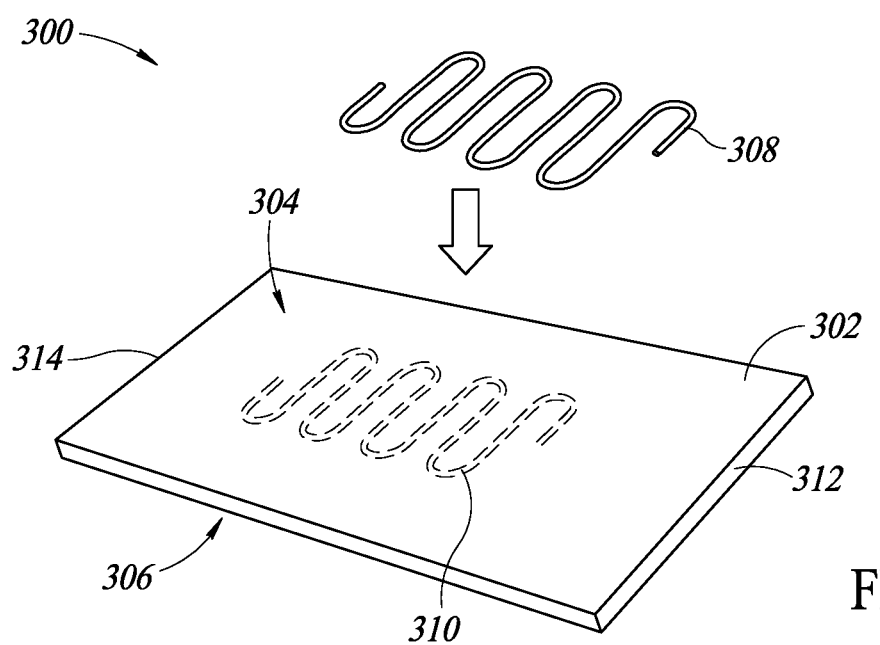
FIG. 4 is a schematic representation of an alternative embodiment of a trace internal to a layer of flexible material.

FIG. 4 illustrates an alternative embodiment of a layer of flexible material 300 (which may also be referred to herein as a flexible interconnect 300). Except as otherwise provided below, the layer of flexible material 300 is the same as the layer of flexible material 200 described with reference to FIG. 3. The layer of flexible material 300 includes a flexible substrate 302 with a first surface 304 and a second surface 306 opposite the first surface 302. A conductive trace 308 is formed in the flexible substrate 302. In other words, at least a portion of the trace 308 is between the first and second surfaces 304, 306 of the flexible substrate 302. Preferably, a portion of the trace 308 extends along the first surface 304 of the flexible substrate, as indicated by dashed lines 310. Alternatively, the trace 308 may extend internally through the flexible substrate 302, except at opposite ends 312, 314 of the flexible substrate 302, wherein at least a portion of the trace 308 is exposed to establish an electrical connection with the substrate 102 or the second die 108 of FIG. 1, for example.

Figure 5:
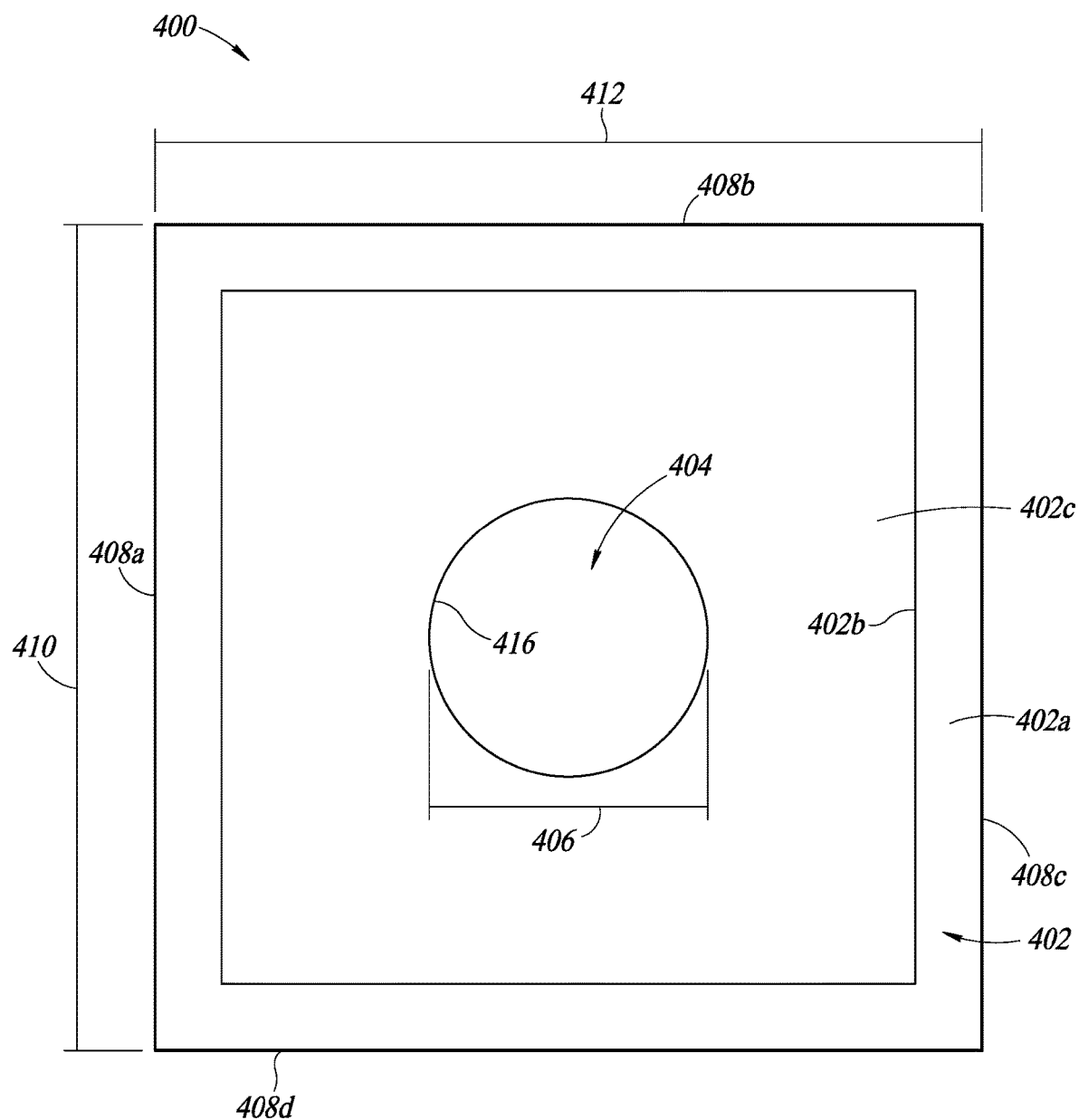
FIG. 5 is a plan view of an embodiment of a cap according to the present disclosure.

FIG. 5 illustrates an embodiment of a cap 400. In one embodiment, the cap 400 is similar to the cap 106 of FIG. 1, except as otherwise described below. As such, the cap 400 can be incorporated into the package 100 instead of the cap 106. FIG. 5 illustrates the cap 400 before a layer of flexible material is applied to the cap 400. The cap includes a surface 402, which in an embodiment, is the second surface 134 referenced in FIG. 1 (e.g. a rear or backside surface). The cap 400 includes an aperture 404 through the cap 400. In this embodiment, the aperture 404 is circular, although the aperture 404 may have any selected geometric shape. The surface 402 includes a first portion 402a, a second portion 402b, and a third portion 402c. In the plan view illustrated, only the edge of the second portion 402b is visible, but it is to be appreciated that the second portion 402b is similar to the second portion 134b of the second surface 134 described with reference to FIG. 1. A width 406 of the aperture 404 is preferably between 0.4 millimeters and 0.6 millimeters. In an embodiment, the width 406 of the aperture 404 is 0.5 millimeters or approximately 0.5 millimeters (e.g. within 5% of 0.5 millimeters). In FIG. 4, the cap 400 has a square shape with four sides 408a, 408b, 408c, 408d. Because the cap 400 is square, each side 408a, 408b, 408c, 408d preferably has a dimension (e.g., a length or width) that is equal to each other side. For example, a length 410 of the first side 408a is equal to a length 412 of the second side 408b.

In an embodiment, the lengths 410, 412 are equal to less than 5 millimeters, while in other embodiments, the lengths 162, 164 are greater than 5 millimeters. Other embodiments include the cap 400 being square or rectangular. Further, although the aperture 404 is circular in the illustrated embodiment and centrally disposed with respect to the cap 400, the shape and the location of the aperture 404 can be selected according to package design and specification. For example, the aperture 404 can also be square or rectangular with a different size, in other embodiments. As mentioned above, the dimensions of the cap 400 and the aperture 404 can be selected according to design and specification of the package 100. Moreover, in an embodiment, the package 100 in FIG. 1 has similar dimensions to the lengths 410, 412 such that the package 100 is also square (or some other shape corresponding to a shape of the cap 400) with a size corresponding to the cap 400.

Figure 6:
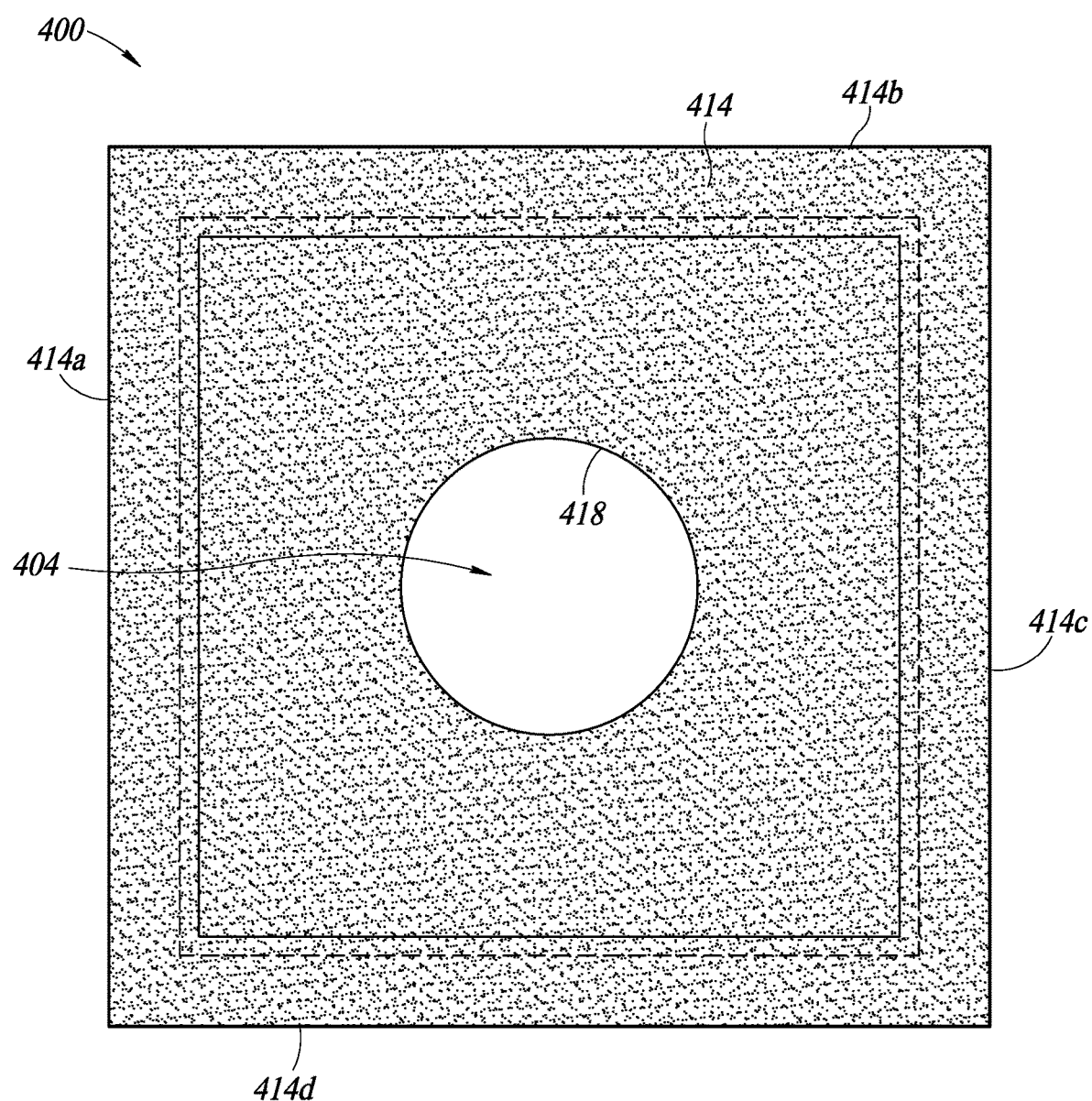
FIG. 6 is a plan view of a layer of flexible material on the cap of FIG. 5.

FIG. 6 illustrates the cap 400 of FIG. 5 with a layer of flexible material 414 covering the entire surface 402 of the cap 400. The layer of flexible material 414 is similar to the layer of flexible material 110 described with reference to FIG. 1 except that in this embodiment, the layer of flexible material 414 covers the entire surface 402 of the cap 400, whereas the layer of flexible material 110 in FIG. 1 terminates proximate the connection between the solder 142 and the conductive trace 112 and does not extend to the aperture 136. In this embodiment, the layer of flexible material 414 extends to the aperture 404. In other words, the layer of flexible material 414 includes edges 414a, 414b, 414c, 414d, which in an embodiment, are outer edges of the layer of flexible material 414. As shown in FIG. 6, the edges 414a, 414b, 414c, 414d of the layer of flexible material extend to sides 408a, 408b, 408c, 408d of the cap 400 shown in FIG. 5. Further, the aperture 404 includes an edge 416 (see FIG. 5) and the layer of flexible material 414 includes an edge 418, which in an embodiment, is an inner edge of the layer of flexible material 414. As shown in FIG. 6, the edge 418 of the layer of flexible material 414 extends to the edge 416 of the aperture 404. Thus, a conductive trace, such as conductive trace 112 (FIG. 1) can be selectively formed on any portion of the layer of flexible material 414 on the surface 402 of the cap 400. The trace is preferably formed in locations where connections between a die, such as second die 108 (FIG. 1) and a substrate, such as substrate 102 (FIG. 1) are desired. These locations can be selected according to design and specification of a package incorporating the cap 400.

Figure 7:
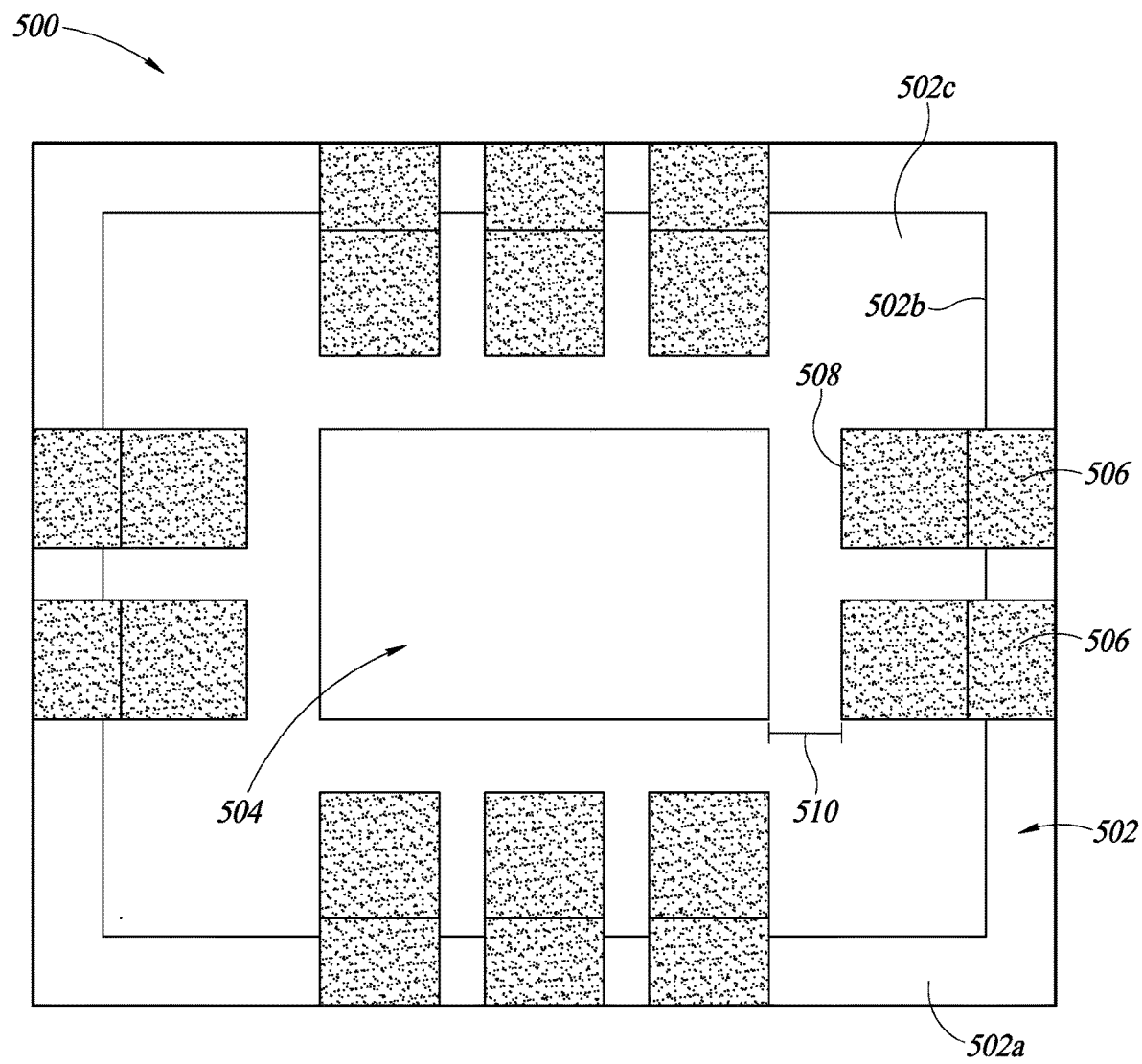
FIG. 7 is a plan view of an alternative embodiment of a cap with multiple layers of flexible material on a surface of the cap according to the present disclosure.

FIG. 7 illustrates an alternative embodiment of a cap 500. In one embodiment, the cap 500 is similar to the cap 106 of FIG. 1, except as otherwise described below. As such, the cap 500 can be incorporated into the package 100 instead of the cap 106. The cap 500 includes a surface 502 with a first portion 502a, a second portion 502b, and a third portion 502c. Only the edge of the second portion 502b is visible in the illustrated plan view, although it is to be appreciated that the second portion 502b is similar to the second portion 134b of the second surface 134 of the cap 106, except potentially with respect to a length or width of the second portion 502b of the surface 502. The cap 500 further includes an aperture 504 extending through the cap 500. The aperture 504 in this embodiment is rectangular in shape, although in other embodiments, the aperture 504 is circular or square, for example.

The cap 500 further includes a plurality of layers of flexible material 506 on the surface 502 of the cap. Each of the layers of flexible material 506 are on the first portion 502a, the second portion 502b, and a part of the third portion 502c of the surface 502. Further, at least one of the layers of flexible material 506 preferably terminate before the aperture 504. In other words, an edge 508 of at least one of the layers of flexible material 506 on the third portion 502c of the surface 502 does not extend to the aperture 504, but rather there is a gap or space 510 between the edge 508 and the aperture 504. Further, although FIG. 7 illustrates each of the layers of flexible material 506 being the same, it is to be appreciated that in other embodiments, the edges 508 terminate at different locations on the surface 502 of the cap 500, or in other words, a length of each of the layers of flexible material 506 can be selected to be different than the other layers 506.

Moreover, although a total of 10 layers of flexible material 506 are illustrated, other embodiments include more or less than 10 layers of flexible material 506. As described with reference to FIGS. 3 and 4, the layers of flexible material 506 are flexible substrates, such as PDMS, for example, on which one or more traces are formed. As such, each of the plurality of layers of flexible material 506 can be disposed in locations on the surface 502 corresponding to a selected location of an electrical connection between a die to be coupled to the trace and a substrate. The cap 500 in this embodiment is rectangular, although other embodiments include the cap 500 being square or circular, for example. Further, a substrate associated with the cap 500 preferably has a similar size and shape, such that the cap 500 can be coupled to the substrate, as described herein.

Figure 8:
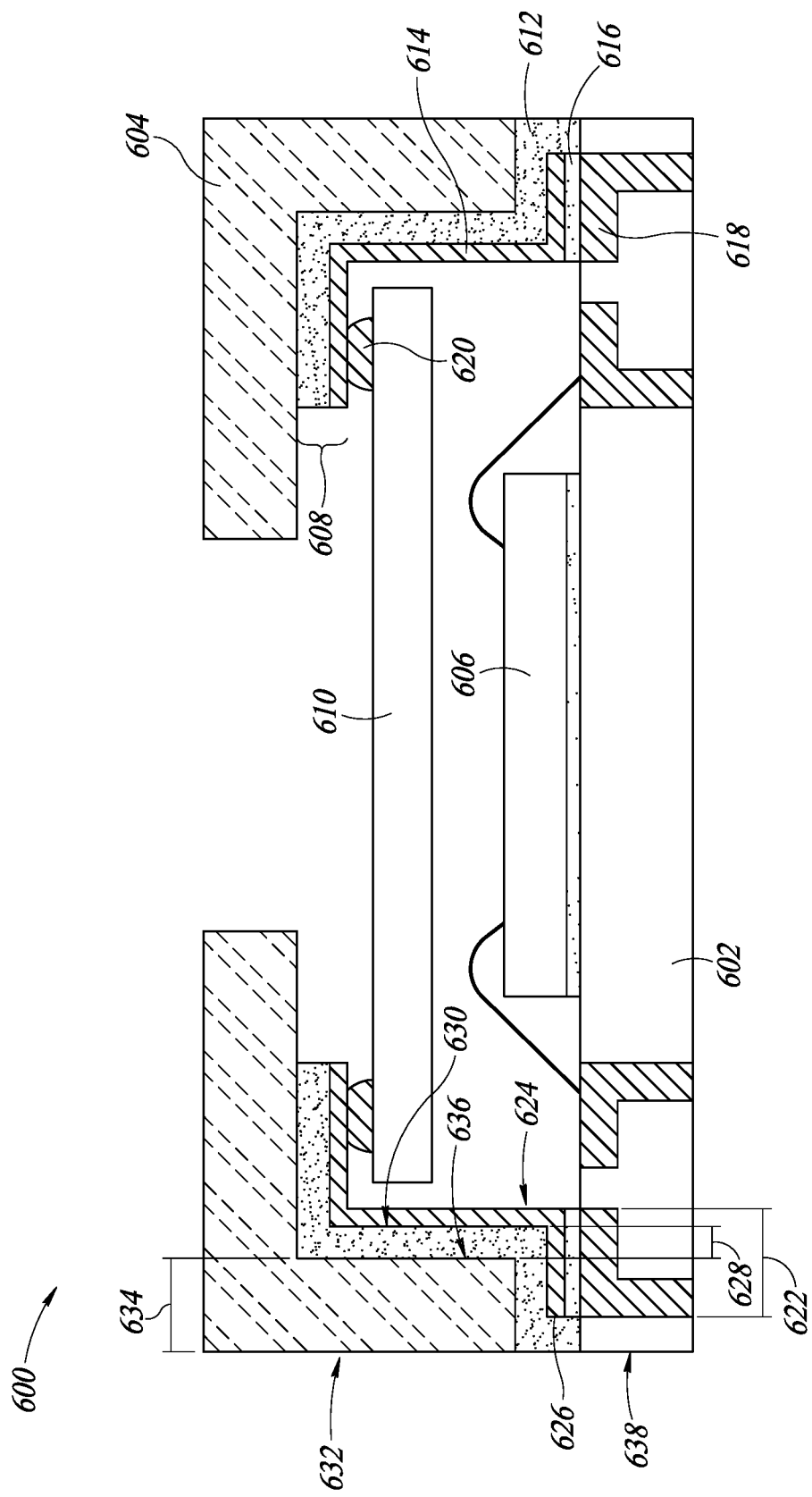
FIG. 8 is a cross-sectional view of an alternative embodiment of a semiconductor package illustrating a layer of flexible material being coplanar with a surface of the cap and a substrate according to the present disclosure.

FIG. 8 illustrates an alternative embodiment of a package 600 according to the present disclosure. The package 600 is the same as the package 100 except as otherwise described below. The package 600 includes a substrate 602, a cap 604 coupled to the substrate 602, a first die 606 on the substrate 602, a flexible interconnect 608 on the cap 604, and a second die 610 coupled to the flexible interconnect 608.

The flexible interconnect 608 includes a flexible substrate 612 (which may also be referred to herein as a layer of flexible material 612) and a conductive trace 614 extending on the flexible substrate 612, similar to the layer of flexible material 200 described with reference to FIG. 3. For example, the flexible substrate 612 is PDMS in an embodiment. In other embodiments, the flexible substrate 612 is an elastic material, such as a composition including one or more of rubber, plastic, thermoplastic, or polymer, alone or in combination and the trace 614 extends, at least part, internal to the substrate 612, as described with reference to FIG. 4. The trace 614 is preferably copper and extends along the flexible substrate 612. The flexible interconnect 608 extends along the cap 604. Further, the flexible interconnect 608 is between the cap 604 and the substrate 602 when the cap 604 is coupled to the substrate 602. More specifically, solder 616 couples the trace 614 to a contact 618 of the substrate 602. The flexible interconnect 608 is thus electrically and physically coupled to the substrate 602. Further, the flexible interconnect 608 is coupled to the cap 604 with an adhesive, as described above with reference to FIG. 1. As such, the solder 616 and the flexible interconnect 608 are coupled between the cap 604 and the substrate 602. Moreover, the second die 610 is coupled to the trace 614 of the flexible interconnect 608 with solder 620. As such, the second die 610 is coupled to the cap 604 and is electrically coupled to the substrate 602 through the flexible interconnect 608. As described with reference to FIG. 1, the first die 608 on the substrate 602 is electrically coupled to the second die 610 through traces in the substrate 602.

The trace 614 has a dimension 622 between a surface 624 of the trace 614 facing the second die 610 and a terminal edge 626 of the trace 614. In an embodiment, the dimension 622 is a width of the trace 614 proximate the substrate 602. The flexible substrate 612 includes a dimension 628 between a surface 630 facing the trace 614 (e.g., the surface 630 the trace 614 is formed on) and a surface 636 of the cap 604 facing the flexible substrate 612 (e.g., the surface 636 that the flexible substrate 612 is adhered to). In an embodiment, the dimension 628 is a thickness of the flexible substrate 612 or a width of the flexible substrate 612 between the trace 614 and the cap 604. Further, the cap 604 has a dimension 634 between the surface 636 of the cap 604 facing the flexible substrate 612 and an outermost surface 632 of the package 600. In the illustrated embodiment, the dimension 622 of the trace 614 is less than or equal to the sum of the dimension 628 of the flexible substrate 612 and the dimension 634 of the cap 604. Put another way, in this embodiment, the width of the trace 614 proximate the substrate 602 is less than or equal to the sum of the width or thickness of the flexible substrate 612 and the cap 604.

As such, the flexible substrate 612 covers the terminal end 626 of the trace 614. In other words, the flexible substrate 612 is coplanar with the outermost surface 632 of the cap 604 and a sidewall surface 638 of the substrate 602, but the trace 614 does not extend to the outermost surface 632 of the cap 604. Because the flexible substrate 612 is preferably an insulating material, the flexible substrate 612 prevents an electrical connection from being established with the trace 614 at the outermost surface 632 of the package 600.

FIGS. 9A through 9F are cross-sectional views of an embodiment of a method for manufacturing or assembly of a semiconductor package 700 of the type described herein. In one embodiment, the semiconductor package 700 is the same as the package 100 described herein.

Figure 9A:
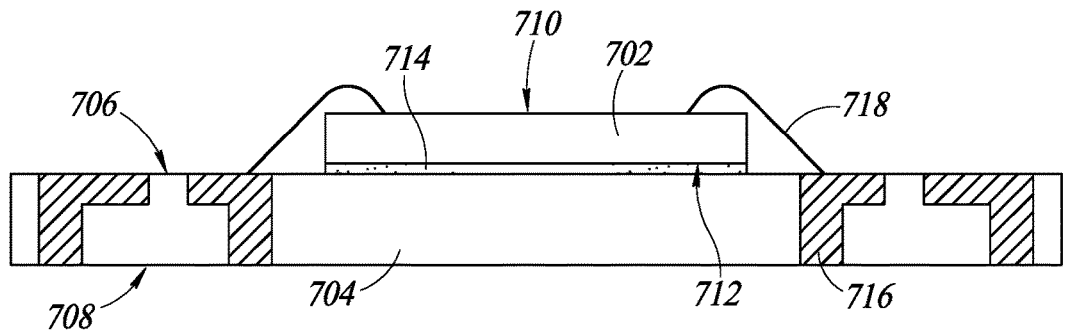
FIGS. 9A-F are cross-sectional views of an embodiment of a method for assembling a semiconductor package with a layer of flexible material between a cap and a substrate of the semiconductor package according to the present disclosure.

The method begins in FIG. 9A, wherein a first semiconductor die 702 is coupled to a substrate 704. The substrate 704 includes a first surface 706 and a second surface 708 opposite the first surface 706. The first die 702 includes a first surface 710 and a second surface 712 opposite the first surface 710. The second surface 712 of the first die 702 is coupled to the first surface 706 of the substrate 704 with a die attach material 714, which may solder, tape, or some other conductive or insulating adhesive. The substrate 704 includes vias 716 through the substrate 704, as described herein. The vias 716 establish contacts on the first surface 706 of the substrate 704. Wires 718 are coupled between the first surface 710 of the first die 702 and the contacts or vias 716 on the first surface 706 of the substrate 704.

Figure 9B:
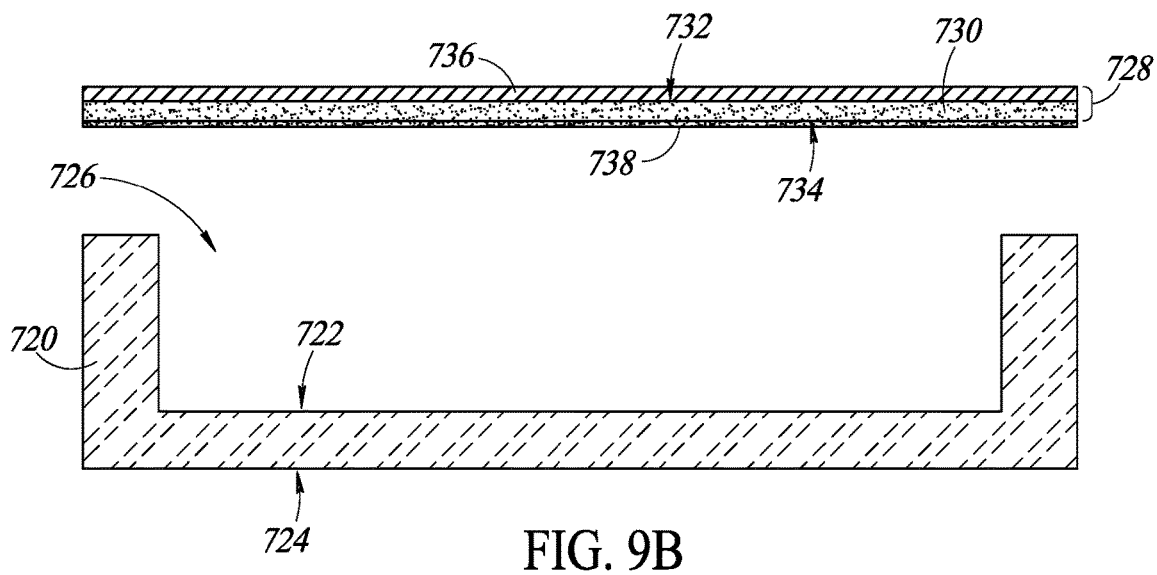
Figure 9C:
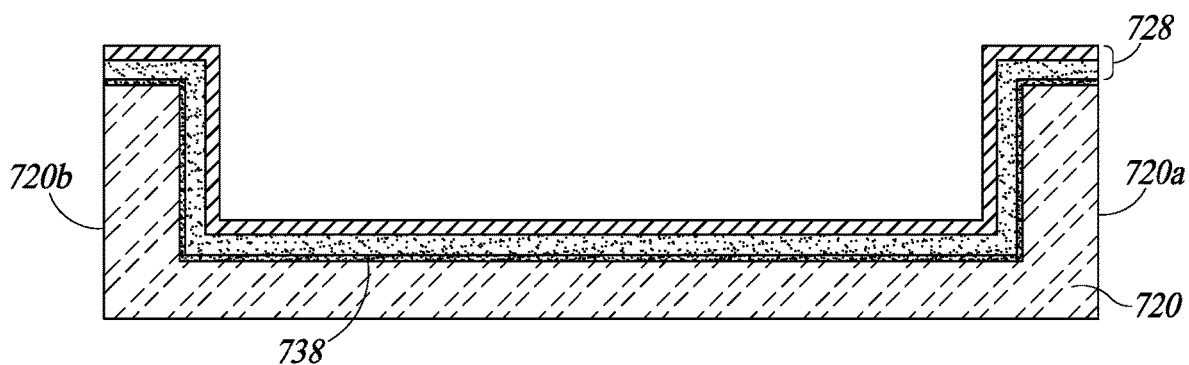

FIGS. 9B and 9C illustrate assembly of a cap 720. In an embodiment, assembly of the cap 720 is separate from coupling the first die 702 to the substrate 704 in FIG. 9A. As such, in one embodiment, assembly of the cap 720 occurs first in the process, while in other embodiments, coupling the first die 702 to the substrate 704 occurs first in the process. The cap 720 includes a first surface 722 and a second surface 724 opposite the first surface 722. A cavity 726 extends into the cap 720 from the first surface 722 towards the second surface 724. In one embodiment, the cap 720 is formed of molded epoxy, wherein the mold for creating the cap 720 has a size and shape for receiving epoxy that is the same as the illustrated cap 720 and as such, the cavity 726 is formed during molding of the cap 720. In an alternative embodiment, the cap 720 is a solid block of molded epoxy and the cavity 726 can be formed by etching, mechanical cutting, stamping, or with a laser, for example. In other embodiments, the cap 720 is metal, in which case the cap 720 can be extruded with the cavity 726, or as a solid block of metal, in which case, the cavity 726 is formed through etching, mechanical cutting, stamping, or with a laser.

FIGS. 9B and 9C further illustrate a flexible interconnect 728. The flexible interconnect includes a flexible substrate 730 with a first surface 732 and second surface 734 opposite the first surface 732. A conductive trace or wire 736 is formed on the first surface 732 of the flexible substrate 730. An adhesive 738 is formed on the second surface 734 of the flexible substrate 730. Then, the flexible interconnect 728 is coupled to the first surface 722 of the cap 720, as in FIG. 9C. The adhesive 738 is cured, such that the flexible interconnect 728 is fixedly coupled to the cap 720. As shown in FIG. 9C, the flexible interconnect 728 preferably covers the entire first surface 722 of the cap 720 at this stage in the manufacturing or assembly process. Put another way, the flexible interconnect 728 extends across the first surface 722 of the cap 720 between opposite outermost edges 720a, 720b of the cap 720. In one embodiment, the cap 720 includes a plurality of flexible interconnect strips, as described with reference to FIG. 7, wherein each strip is coupled to the 720 and in spaced relationship relative to the other strips.

Figure 9D:
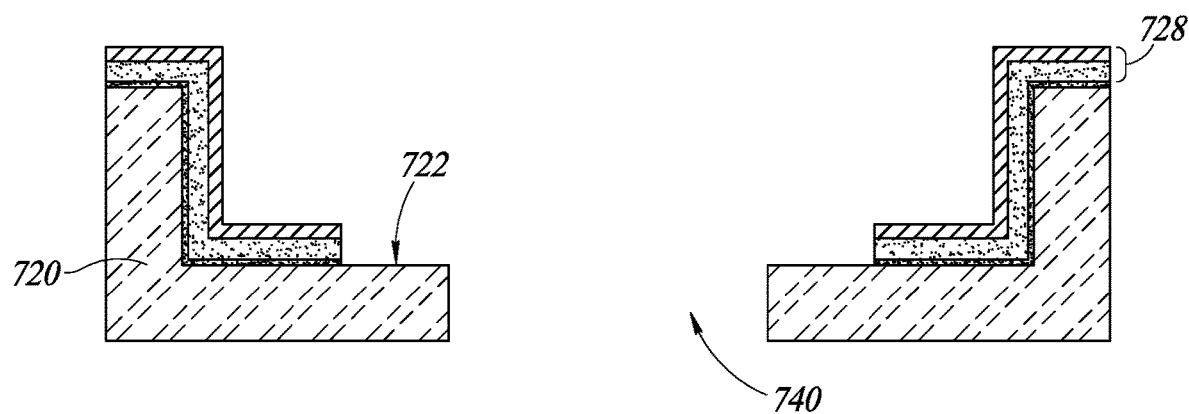

Then, in FIG. 9D, a portion of the flexible interconnect 728 is removed through routing, laser patterning, cutting, or etching to expose the second surface 722 of the cap 720. After the portion of the flexible interconnect 728 is removed, an aperture 740 is formed through cap 720 through etching, mechanical or laser cutting, or stamping. In other words, a portion of the cap 720 is removed to create the aperture 740. In one embodiment, the portion of the flexible interconnect 728 is removed first and then the aperture 740 is formed, while in other embodiments, the aperture 740 is formed first through the cap and the flexible interconnect 728 and then the portion of the flexible interconnect 728 is removed. In yet further embodiments, only the aperture 740 is formed through the cap 720 and the portion of the flexible interconnect 728 is not removed, such that the flexible interconnect 728 extends along the cap 720 to terminate at the aperture 740.

Figure 9E:
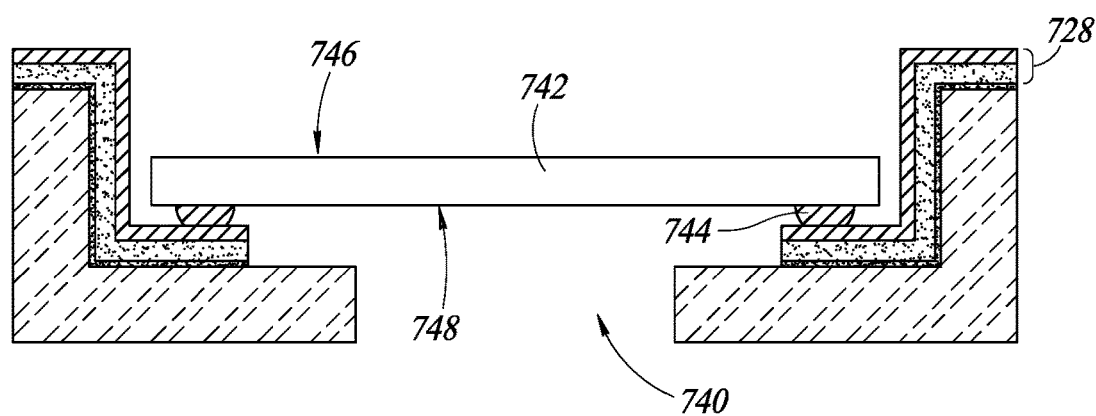

In FIG. 9E, a second semiconductor die 742 is coupled to the flexible interconnect 728 with solder 744. The second die 742 includes a first surface 746 and a second surface 748 opposite the first surface 746. In this embodiment, the second surface 748 faces the aperture 740 such that the second die 742 is exposed to an ambient environment through the aperture 740.

Figure 9F:
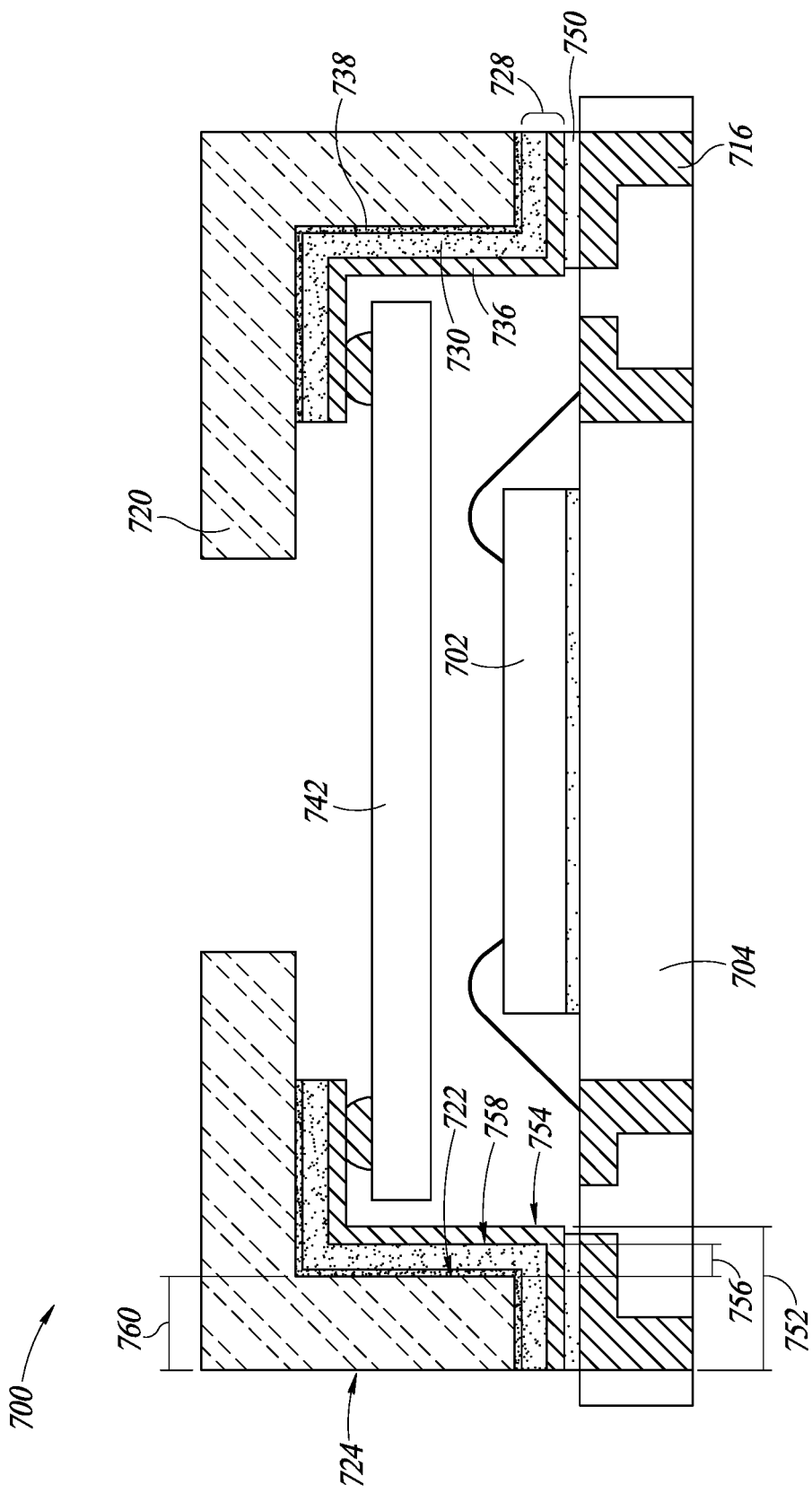

Finally, in FIG. 9F, the cap 721 and the flexible interconnect 728 are coupled to the substrate 704 with solder 750. Coupling the flexible interconnect 728 and the cap 720 to the substrate 702 includes the flexible interconnect 728 being between the cap 720 and the substrate 702. Further, the coupling includes establishing an electrical connection between the second die 742 and the substrate 702 via the trace 736 of the flexible interconnect 728 as well as between the second die 742 and the first die 702 through the trace 736, the vias 716 and traces in the substrate 704.

FIG. 9F further illustrates that the trace 736, the flexible substrate 730, and the cap 720 have different dimensions compared to FIG. 8. For example, the trace 736 includes a dimension 752 between a surface 754 of the trace 736 facing the second die 742 and the second surface 724 of the cap 720. In an embodiment, the dimension 752 is a width of the trace 736 proximate the substrate 704. Further, the flexible substrate 730 has a dimension 756 between a surface 758 of the flexible substrate 730 facing the trace 736 (e.g. the surface 758 on which the trace 736 is formed) and the adhesive 738. In an embodiment, the dimension 758 is a width or thickness of the flexible substrate 730. Finally, the cap 720 has a dimension 760 between the first surface 722 of the cap 720 and the second surface 724 of the cap 720. In one embodiment, the dimension 760 is a width of the cap 720.

Moreover, the adhesive 738 has a thickness as well that is preferably constant across the cap 720. In this embodiment, the dimension 752 of the trace 736 is greater than or equal to the sum of the dimension 756, the dimension 760, and the thickness of the adhesive 738. In other words, the width of the trace 736 proximate the substrate 704 is greater than or equal to the sum of the width of the cap 720, the width of the flexible substrate 730, and the width of the adhesive 738. As such, a portion of the trace 736 is exposed at the second surface 724 of the cap 720. However, because the dimensions in FIG. 9F are exaggerated, there is a low likelihood, if any, of an electrical connection forming with the trace 736 at the second surface 724 of the cap 720 because the trace 736 is sufficiently small or thin to avoid the same.

As such, the embodiments of the present disclosure provide semiconductor packages, and more specifically, cavity type semiconductor packages with a flexible interconnect on a cap and coupled between the cap and a substrate of the package to reduce stress in the package as a result of expansion and contraction of the components of the package during and after operation. Thus, embodiments of the present disclosure reduce the likelihood of separation of the cap from the substrate and of a semiconductor die coupled to the flexible interconnect from the cap, which improves package reliability and increases the useful package life expectancy.

In the above description, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known structures associated with semiconductor devices and packages, such as cavity type packages and MEMS devices, have not been shown or described in detail to avoid unnecessarily obscuring descriptions of the embodiments.

Unless the context requires otherwise, throughout the specification and claims which follow, the word "comprise" and variations thereof, such as, "comprises" and "comprising" are to be construed in an open, inclusive sense, that is as "including, but not limited to." Further, the terms "first," "second," and similar indicators of sequence are to be construed as interchangeable unless the context clearly dictates otherwise.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its broadest sense that is as meaning "and/or" unless the content clearly dictates otherwise.

The relative terms "approximately" and "substantially," when used to describe a value, amount, quantity, or dimension, generally refer to a value, amount, quantity, or dimension that is within plus or minus 5% of the stated value, amount, quantity, or dimension, unless the context clearly dictates otherwise. It is to be further understood that any specific dimensions of components or features provided herein are for illustrative purposes only with reference to the exemplary embodiments described herein, and as such, it is expressly contemplated in the present disclosure to include dimensions that are more or less than the dimensions stated, unless the context clearly dictates otherwise.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
a substrate having a first surface and a second surface opposite to each other;
a first semiconductor die on the first surface of the substrate;
a cap coupled to the substrate, the cap having a first surface, a second surface opposite to the first surface, and an aperture that extends through the cap from the first surface to the second surface;
a layer of flexible material on the second surface of the cap and between the second surface of the cap and the first surface of the substrate;
a conductive trace on the layer of flexible material; and
a second semiconductor die coupled to the conductive trace on the layer of flexible material on the cap, the second semiconductor die overlaps the aperture and the first semiconductor die, and the second semiconductor die extends fully across the aperture.

2. The device of claim 1 wherein the cap includes a first portion and a second portion transverse to the first portion.

3. The device of claim 1 wherein the conductive trace includes an end coplanar with the second surface of the cap.

4. The device of claim 3 wherein the layer of flexible material includes an end coplanar with the second surface of the cap and the end of the conductive trace.

5. The device of claim 1 wherein the layer of flexible material is on a portion of the second surface of the cap.

6. The device of claim 1 wherein the substrate further includes a plurality of conductive vias through the substrate from the first surface to the second surface, the conductive trace coupled to at least one of the plurality of conductive vias.

7. The device of claim 1 wherein the layer of flexible material includes an end coplanar with the second surface of the cap, the end of the layer of flexible material being on a terminal end of the conductive trace.

8. A device, comprising:
a substrate;
a cap coupled to the substrate, the cap includes an outer surface and an aperture that extends through the cap;
a flexible interconnect extending along the cap and disposed between the cap and the substrate, the flexible interconnect includes:
a first end coplanar with the outer surface of the cap; and
a second end opposite to the first end and spaced from the aperture in the cap;
a first semiconductor die coupled to the flexible interconnect, the first semiconductor die electrically coupled to the substrate through the flexible interconnect.

9. The device of claim 8 wherein the first semiconductor die includes a first surface and a second surface opposite to each other, the device further comprising:
a second semiconductor die coupled to the substrate and having a first surface and a second surface opposite to each other, the first surface of the first semiconductor die facing the first surface of the second semiconductor die.

10. The device of claim 9 wherein the first semiconductor die is electrically coupled to the second semiconductor die through conductive traces in the substrate.

11. The device of claim 8 wherein the flexible interconnect includes a polydimethylsiloxane substrate and a conductive trace on the polydimethylsiloxane substrate.

12. The device of claim 8 wherein the flexible interconnect includes a polydimethylsiloxane layer with a surface and a conductive trace in the polydimethylsiloxane layer and on the surface.

13. The device of claim 8 wherein the flexible interconnect includes a flexible substrate with a surface and a conductive trace extending on the surface of the flexible substrate, and the substrate further includes an electrical contact, the conductive trace coupled between the first semiconductor die and the electrical contact of the substrate.

14. A method, comprising:
applying a flexible interconnect to a cap;
after applying the flexible interconnect to the cap, removing a portion of the flexible interconnect;
coupling a first semiconductor die to the flexible interconnect and the cap;
coupling the flexible interconnect and the cap to a substrate, the coupling including positioning the flexible interconnect between the substrate and the cap, the coupling further including establishing an electrical connection between the first semiconductor die and the substrate.

15. The method of claim 14 further comprising, before applying the flexible interconnect:
coupling a second semiconductor die to a surface of the substrate.

16. The method of claim 15 wherein coupling the flexible interconnect and the cap to the substrate includes establishing an electrical connection between the first semiconductor die and the second semiconductor die through contacts and traces in the substrate.

17. The method of claim 14 further comprising, after applying the flexible interconnect to the cap:
removing a portion of the cap.

18. The method of claim 14 wherein applying the flexible interconnect to the cap includes applying the flexible interconnect to a surface of the cap extending between outermost edges of the cap.

19. The method of claim 14 wherein applying the flexible interconnect to the cap includes applying a plurality of separate flexible interconnect strips to a surface of the cap in spaced relationship to one another.

20. The method of claim 17 further comprising forming an aperture by removing the portion of the flexible interconnect and removing the portion of the cap, and wherein coupling the first semiconductor die to the flexible interconnect and the cap includes positioning the first semiconductor die extending fully across the aperture.

* * * * *